(12) United States Patent
Chouly et al.

(10) Patent No.: US 6,922,446 B1
(45) Date of Patent: Jul. 26, 2005

(54) DIGITAL TRANSMISSION SYSTEM, DECODER AND DECODING METHOD

(75) Inventors: Antoine Chouly, Paris (FR); Américo Brajal, Villeneuve-le-Roi (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/193,621

(22) Filed: Nov. 17, 1998

(30) Foreign Application Priority Data

Nov. 18, 1997 (FR) .............................................. 97 14451

(51) Int. Cl.$^7$ .............................................. H04B 15/00

(52) U.S. Cl. ........................ 375/285; 375/341; 714/794

(58) Field of Search ................................ 375/285, 229, 375/227, 340, 341, 316; 370/342, 324, 325, 433, 450; 714/755, 774, 794, 790

(56) References Cited

U.S. PATENT DOCUMENTS

| | | | | |
|---|---|---|---|---|
| 6,038,696 A | * | 3/2000 | Chouly et al. | 714/786 |
| 6,145,114 A | * | 11/2000 | Crozier et al. | 714/794 |
| 6,161,209 A | * | 12/2000 | Moher | 714/780 |
| 6,233,709 B1 | * | 5/2001 | Zhang et al. | 714/774 |
| 6,272,183 B1 | * | 8/2001 | Berens et al. | 375/262 |

* cited by examiner

Primary Examiner—Khai Tran (57) ABSTRACT

A digital transmission system utilizing data coding at the transmitter and data decoding at the receiver, the decoding being iterative, reliability data about soft decisions being calculated for each iteration. The last iteration results in a hard decision. Soft decisions are transformed so as to normalize the mean value of the reliability data, using evolutive weighting of the soft decisions with the received data. The coding is preferably a product code concatenated with a block code such as, for example, a Reed Solomon code. Such coding is well suited to upstream transmission in an interactive satellite communication system.

10 Claims, 6 Drawing Sheets

DIGITAL TRANSMISSION SYSTEM, DECODER AND DECODING METHOD

FIELD OF THE INVENTION

The invention relates to a digital transmission system comprising at the transmitting end data coding means and at the receiving end iterative decoding means, said iterative decoding means using received data as initial input data, and including calculating means for calculating for each iteration reliability data relating to soft decisions based on input data, and means for reinserting subsequent input data for the next iteration.

The invention also relates to a decoding method and a decoder.

The invention has interesting applications for transmission systems with small data packets on a channel of limited power, for example, for interactive two-way satellite transmission systems. In such interactive systems, a return channel is provided for permitting the subscribers to interact with the data sent to them. The capacity of this return channel is distributed over the subscribers via the use of a reservation mechanism. This reservation mechanism consists of transmitting requests for being assigned time windows in a next upstream frame. The transmitted data are thus formed by sequences of small request packets or data packets which are transmitted by various subscribers, which implies that each packet is to be coded independently. Moreover, as the subscriber has a small antenna, the power of the upstream channel is limited. Such systems thus make the use of a very powerful coding/decoding method necessary (for this type of application it is necessary to have a packet error rate of less than $10^{-5}$).

BACKGROUND OF THE INVENTION

An iterative decoding method for multidimensional single parity codes is described in the article entitled "Efficient soft-in-soft-out sub-optimal decoding rule for single. parity check codes", published in Electronics Letters of 11 Sep. 1997 (vol. 33, no. 19).

The invention notably has for its object to propose a solution that permits of improving the performance obtained with the prior art decoding method.

SUMMARY OF THE INVENTION

For this purpose, a transmission system as described in the opening paragraph is characterized in that said decoding means comprise transforming means for calculating transformed data based on said soft decisions so as to normalize the mean value of said reliability data, and means for generating subsequent input data based on said transformed data.

The invention also permits to take into account that the reliability data are theoretically distributed according to a Gaussian distribution around the value+1.

In another advantageous embodiment of a transmission system according to the invention, said decoding means comprise weighting means for calculating weighted sums of a function of said soft decisions and of said initial input data with a first and a second weight factor respectively, and means for generating subsequent input data based on said weighted sums.

Such a weighting makes it possible to avoid the propagation of wrong decisions made at the beginning of the iterative decoding method. When said function is chosen for producing transformed data based on soft decisions, the advantages of the two embodiments which have just been described are combined.

Similarly, a data decoding method according to the invention, using said data as initial input data, is characterized in that it comprises:

in a first embodiment, a transforming step for calculating transformed data based on said soft decisions so as to normalize the mean value of said reliability data, and a step for generating subsequent input data based on said transformed data, and in a second embodiment, a weighting step for calculating weighted sums of a function of said soft decisions and of said initial input data with a first and a second weight factor respectively, and a step for generating subsequent input data based on said weighted sums.

Finally, a decoder according to the invention having interactive data decoding means using said data as initial input dat is characterized in that said decoding means comprise:

in a first embodiment, transforming means for calculating transformed data based on said soft decisions so as to normalize the mean value of said reliability data, and means for generating subsequent input data based on said transformed data, and in a second embodiment, weighting means for calculating weighted sums of a function of said soft decisions and of said initial input data with a first and a second weight factor respectively, and means for generating input subsequent data based on said weighted sums.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

The invention will now be described for data transmission applications. This is not restrictive. For example the invention can also be used for the retrieval of data stored on a disk.

In the following of the description, known techniques of error control in digital transmission are used. For more details on these techniques, one may be referred to the book by Arnold M. Michelson and Allen H. Levesque entitled "Error control techniques for digital communications" published in the Wiley Intersciences Editions in 1985.

In the following of the description, the expression "product code" or "multidimensional code" designates a code that may be represented by a matrix of various dimensions of which each dimension gives a code word, while different codes and code word sizes may be used for each dimension.

Now there will be described an example of a digital transmission system according to the invention whose performance sufficient for upstream satellite transmission applications stated above. This example is not restrictive.

More particularly (and as this is explained in detail in the following of the description) for improving the performance of the system a Reed Solomon code and a two-dimensional interleaved parity product code are concatenated (each row and each column of the matrix form a code word, and the code used is a parity code for both of the two dimensions). But the invention is applicable to any type of code that may be decoded with an interactive decoding method, notably to any type of code utilizing a product code.

Similarly, a four-state QPSK (Quadrature Phase Shift Keying) constellation is used, so that the decoding consists of making decisions between two possible values (here between −1 and +1) for each received symbol on the in-phase and quadrature channels. Another type of constellation could be used, for example, an OQPSK (Offset Quadrature Phase Shift Keying constellation in which a shift by half a symbol between the two channels is introduced). Also a constellation of a different size could be used, for example, a BPSK (Binary Phase Shift Keying) constellation or a constellation of a larger size. With a constellation of a larger size, for example it is possible it boils down to the same type of decisions to be made by using known multi-level coding techniques. Or the conventional iterative decoding method may be adapted to the new type of decisions to be made.

Figure 1:
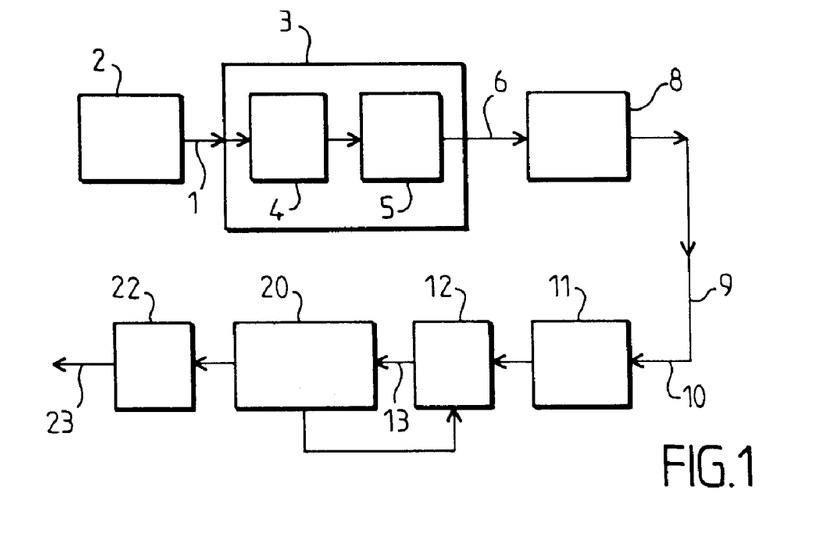
FIG. 1 is a diagram of an example of a digital transmission system according to the invention.

In FIG. 1 is shown a diagram of such a digital transmission system. At the transmitting end, the data to be protected 1, coming from a source 2 are transmitted to coding means 3. These coding means are formed by first Reed Solomon coding means 4 cascaded with second multidimensional interleaved parity coding means 5. The coded data 6 produced on the output of the coding means 3 are assigned to symbols of a constellation by modulation means 8. These symbols are transmitted through a channel 9.

At the receiving end, the received data 10 are processed by usual demodulation means 11, then stored in a memory 12 in the form of a first matrix. These received data form initial input data which means that they are used as input data 13 by iterative decoding means 20 for the first iteration. The data produced on the output of the iterative decoding means are regrouped into a second matrix stored in the memory 12 and are used as subsequent input data 13 for the next iteration. The iterative decoding means 20 are arranged in cascade with conventional Reed Solomon decoding means 22 which produce final decisions 23 about the received data.

By way of example, for the decoding is used the Reed Solomon code whose generating polynomial is $$\prod_{i=1}^{2t}(x+\alpha^i)$$

where α is the root of $x^8 \oplus x^4 \oplus x^3 \oplus x^2 \oplus 1$, which polynomial generates the Galois field of 256 elements $GF(2^8)$, and t is the number of octets the code is capable of correcting. In the example described here, t is chosen to be 5. Thus, if data packets of 54 octets (ATM cell plus reserved octets) are transmitted, packets of 64 octets are obtained on the output of the Reed Solomon coding means 4.

The multidimensional interleaved parity coding means 5 add a parity bit to each of the octets produced on the output of the Reed Solomon coding means. 4, then regroup the obtained 8 words of 9 bits to form an 8×9 matrix. A parity bit is then added to each column of the matrix so as to form a new row. The matrix resulting therefrom is a 9×9 matrix. Thus, while returning to the preceding example, based on 64 octets produced on the output of the Reed Solomon coding means 4, eight 9×9 matrices are obtained (denoted M1 to M8) on the output of the multidimensional interleaved parity coding means 5.

Figure 2:
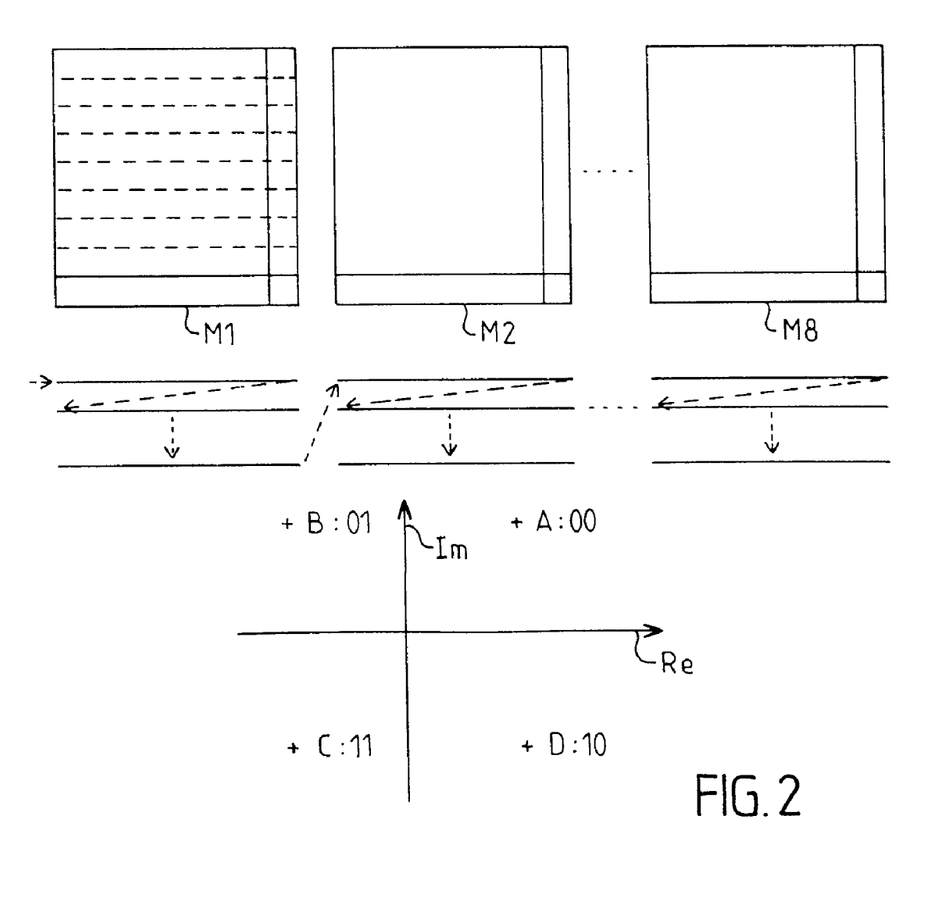
FIG. 2 is an explanatory diagram of a principle of assigning coded data to a constellation.

These eight matrices are gone through as indicated in FIG. 2 by assigning to each bit pair one point of a QPSK constellation. When the channel 9 is a channel of limited power it is advantageous to use a differential coding. In that case, for example, the following assigning rule between two consecutive symbols is applied:

00: no phase change,
01: +90°,
11: +180°
10: −90°.

The iterative decoding principle (or turbo decoding) was explained in May 1993 at the conference "Near Shannon error correcting coding and decoding: turbo codes" by A. Glavieux et al., IEEE ICC-93, pp. 1064–1071. It consists of coming near to an optimum decoding by carrying out N iterations of a non-optimum decoding. The N-1$^{st}$ iterations consist of making a soft decision equal to the product of a reliability data about a received symbol and the decision called hard decision made for this symbol, and reinserting this soft decision into the input of the decoding means for the next iteration. The last iteration produces a hard decision.

In the example that is described here, this iterative decoding makes it possible to make binary decisions about real received symbols, knowing that each element of a code word has a value in the set {−1; +1}, and consists of alternating various times a row decoding and a column decoding of the matrix of the input data. Each row decoding or column decoding forms a decoding iteration. In the following, the number of necessary iterations for converging to an optimum decoding is denoted N. The real received symbols are used as initial input data for the first iteration. The N−1 first iterations make it possible to calculate for each element $r_{i,j}$ of each row or column a reliability data $f_{i,j}$ and a soft decision $r'_{i,j}$, and thereafter, in accordance with the invention, a data $r''_{i,j}$ derived from this soft decision. The data $r''_{i,j}$ calculated for an iteration j are stored in the memory 12 and used as subsequent input data $r_{i,j+1}$ by the iterative decoding means 20 for the iteration j+1. The last iteration consists of decoding in optimum fashion the block $r_{i,N}$ (i=1,0 . . . , n), without calculating the reliabilities of the symbols $r_{i,N}$.

Figure 3:
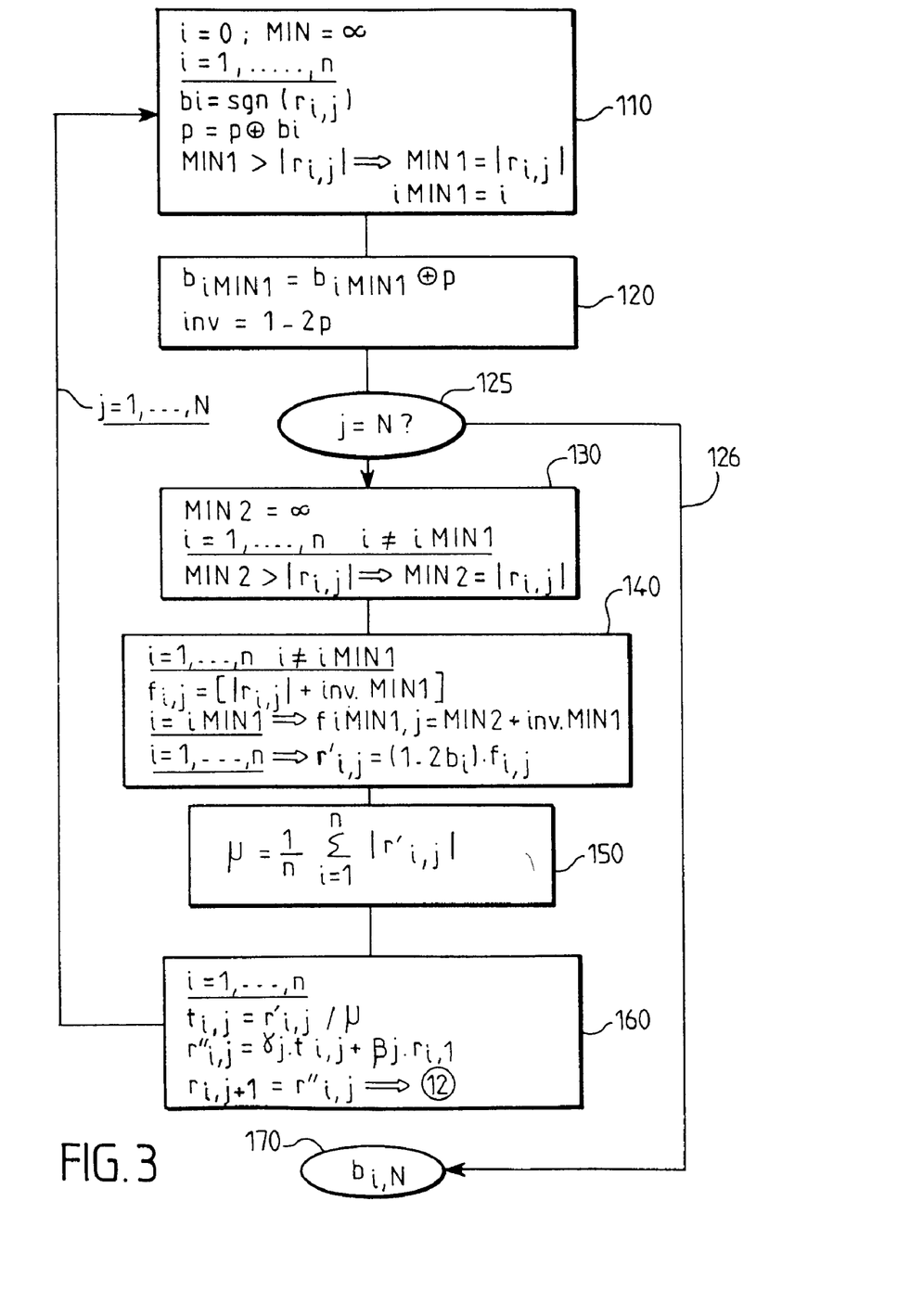
FIG. 3 is a diagram summarizing the main steps of an iterative decoding method according to the invention.

As this is summarized in FIG. 3, an iterative decoding method according to the invention comprises the following steps for each iteration and for each row or column ($r_{1,j}, \ldots, r_{i,j}, \ldots, r_{n,j}0$):

first step 110: calculation of the parity p of the row or of the column and search for the least reliable symbol $r_{i,j}$, that is to say, the nearest to zero (this symbol is called first minimum and denoted MIN1):

initialization: p=0 and MIN1=∞,
for i varying from 1 to n,
  calculation of $b_i$=sgn($r_{i,j}$), with sgn(x)=0 if x>0 and 1 if not,
  calculation of p=p⊕$b_i$,
  if MIN1>|$r_{i,j}$| then MIN1=|$r_{i,j}$| and iMIN1 =i,
second step 120: correction of the least reliable symbol and calculation of a sign indicator denoted inv:
$b_{iMIN1}$=$b_{iMIN1}$⊕p,
  third step 125: test j=N?
if j=N, the decoding is terminated which is symbolized in FIG. 3 by an arrow 126 to a box 170 ending the process. The hard decisions are formed by block b, (i=0, . . . n). If j≠N, the iteration is carried on with the following steps 130 to 160.
  fourth step 130: search for the second minimum denoted MIN2:
initialization: MIN2=∞
for i varying from 1 to n and i≠iMIN1,
  if MIN2>|$r_{i,j}$|, then MIN2=|$r_{i,j}$|.
  fifth step 140: calculation of the reliability $f_{i,j}$ and of the soft decision $r'_{i,j}$:
for i varying from 1 to n and i≠iMIN1 , $f_{i,j}$=[|$r_{i,j}$|+inv.MIN1]
for i=iMIN1, $f_{iMIN1,j}$=MIN2+inv.MIN1
and for any i varying from 1 to n, $r'_{i,j}$=(1-2$b_i$).$f_{i,j}$.
(this calculation of reliability is a conventional calculation of which the principle is recalled, for example, in the article "Efficient soft-in-soft-out sub-optimal decoding rule for single parity check codes" which has been cited in the opening paragraphs).
  sixth step 150: calculation of the mean value $\mu$ of the soft decisions of the row or of the column:

$$\mu = \frac{1}{n}\sum_{i=1}^{n} |r'_{i,j}|$$

It will be noted that in the case where the matrix of the received symbols is small, it is advantageous to calculate the mean value $\mu$ of the whole matrix and not only of a row or a column.
  seventh step 160: calculation of the transformed data $t_{i,j}$, of the weighted sums $r''_{i,j}$, and storage of the subsequent input data $r_{i,j-1}$=$r''_{i,j}$ in the memory 12:
for i varying from 1 to n,
  calculation of $t_{i,j}$=$r'_{i,j}/\mu$,
  calculation of $r''_{i,j}$=$\gamma_j.t_{i,j}$+$\beta_j.r_{i,1}$,
where $\gamma_j$ and $\beta_j$ are the first and second weight factors and $r_{i,j}$ are the received symbols which correspond to this row or this column. Advantageously, $\beta_j$ is chosen to be equal to 1-$\gamma_j$, and $\gamma_1$=0.5, $\gamma_2$=0.8 and $\gamma_{j\neq1,2}$=1. Thus, by diminishing the weight of the received symbols in accordance with the iterations, one takes into account the fact that the risk of divergence diminishes with the number of iterations, whereas the error correction increases.

Figure 4:
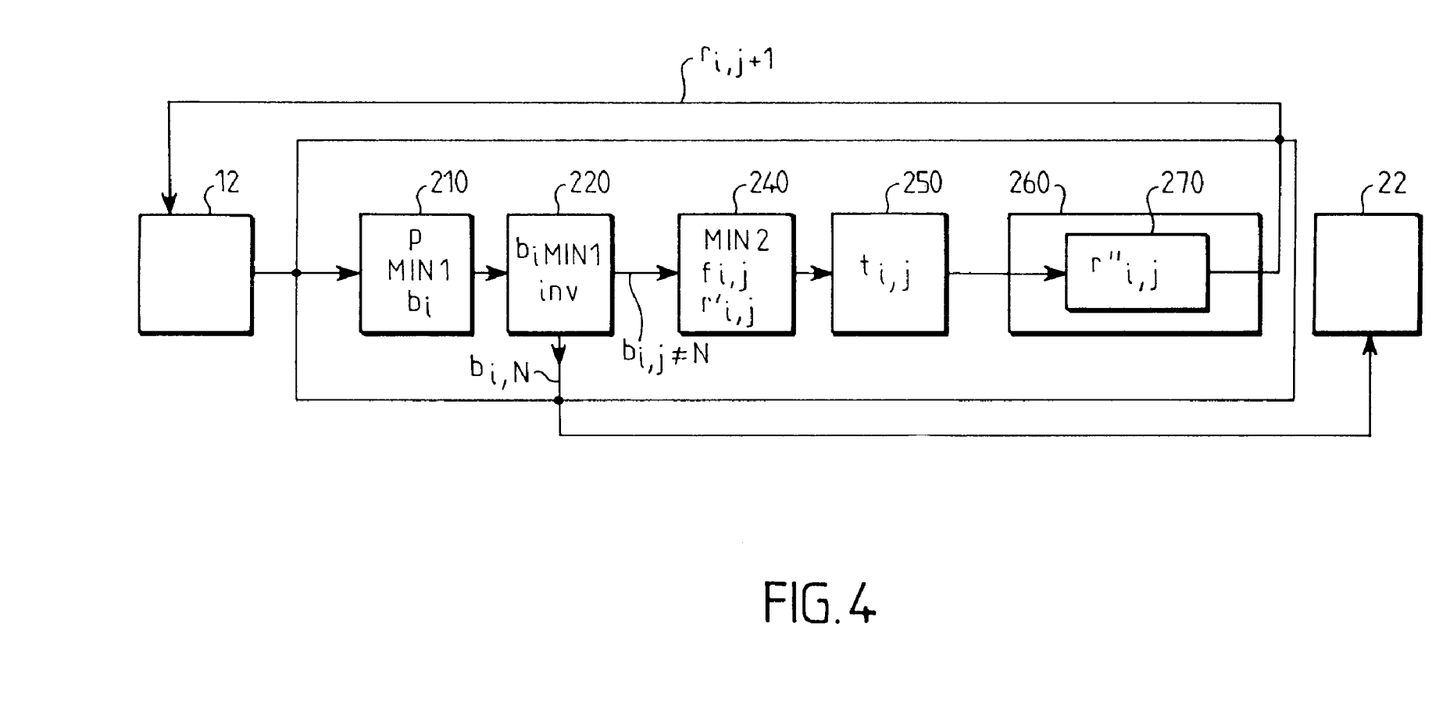
FIG. 4 is a diagram of an iterative decoder according to the invention.

In FIG. 4 is represented a detailed diagram of the iterative decoding means 20. The iterative decoding means 20 comprise:
  parity correction means 210 for searching for the first minimum of each processed row or column and for working out hard decisions $b_i$,
  correcting means 220 for correcting the hard decision relating to the least reliable symbol ($b_{iMIN1}$=$b_{iMIN1}$⊕p), and for calculating a sign indicator inv =1-2p. The hard decisions $b_{i,j\neq N}$ are transmitted to means 240. The hard decisions $b_{i,N}$ are transmitted to the Reed Solomon decoding means 22.
  calculating means 240 for calculating reliability data $f_{i,j}$ and soft decisions $r'_{i,j}$,
  transforming means 250 for calculating transformed data $t_{i,j}$ based on soft decisions $r'_{i,j}$, so as to normalize the mean value of the reliability data $f_{i,j}$,
  means 260 for developing subsequent input data based on said transformed data $t_{i,j}$, these means 260 being formed in the example of embodiment which is described here by weighting means 270 for calculating weighted sums $r''_{i,j}$ of said transformed data $t_{i,j}$ and of the initial input data $r_{i,1}$, with a first and a second weight factor $\gamma_j$ and $\beta_j$, respectively. These weighted sums $r''_{i,j}$ are stored in the memory 12 so as to be fed as subsequent input data $r_{i,j+1}$ to the iterative decoding means 20 for the next iteration j+1.

Figure 5A:
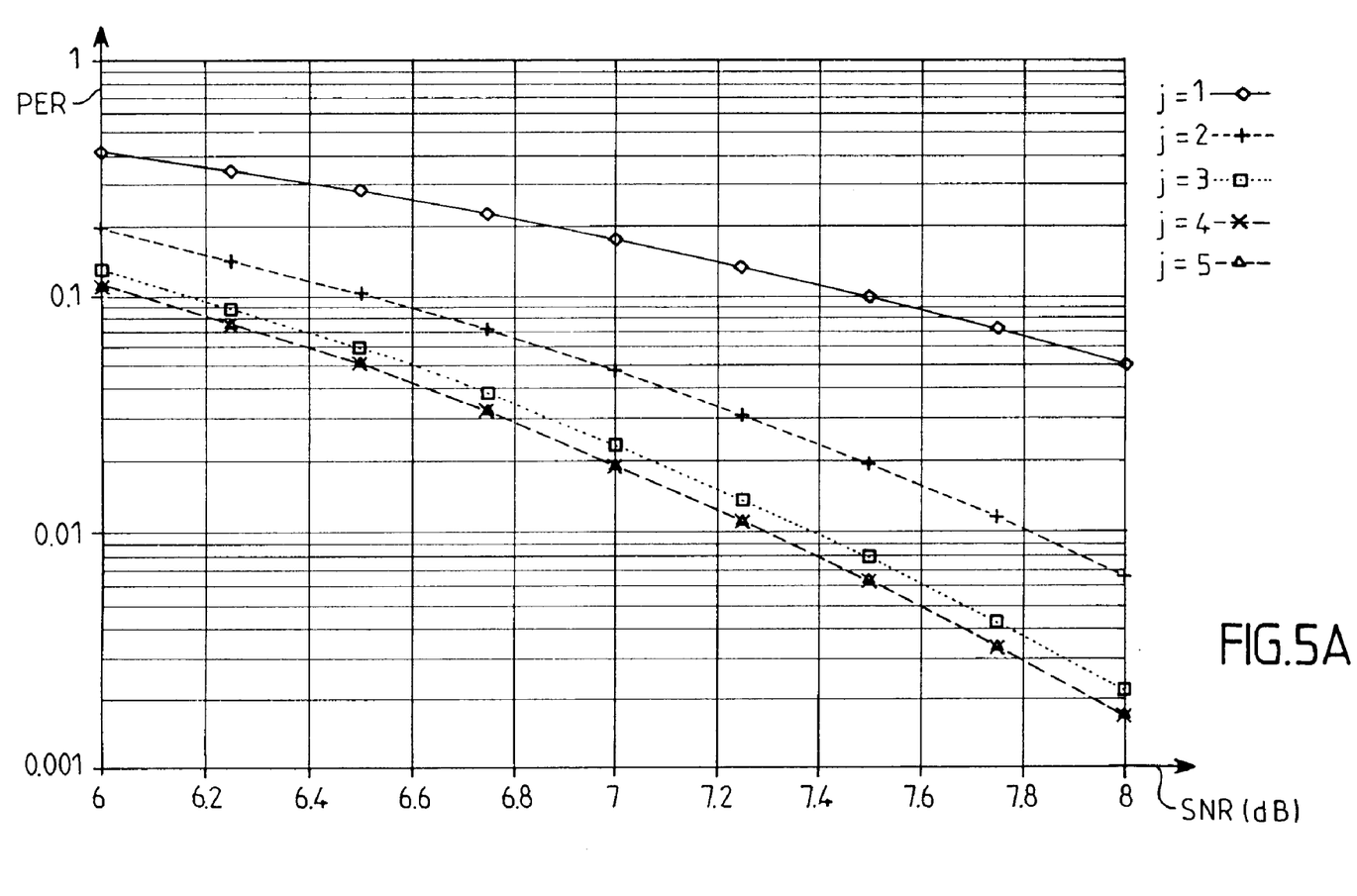
FIGS. 5A and 5B are diagrams representing the results obtained with a system according to the invention before and after the Reed Solomon decoding, respectively.
Figure 5B:
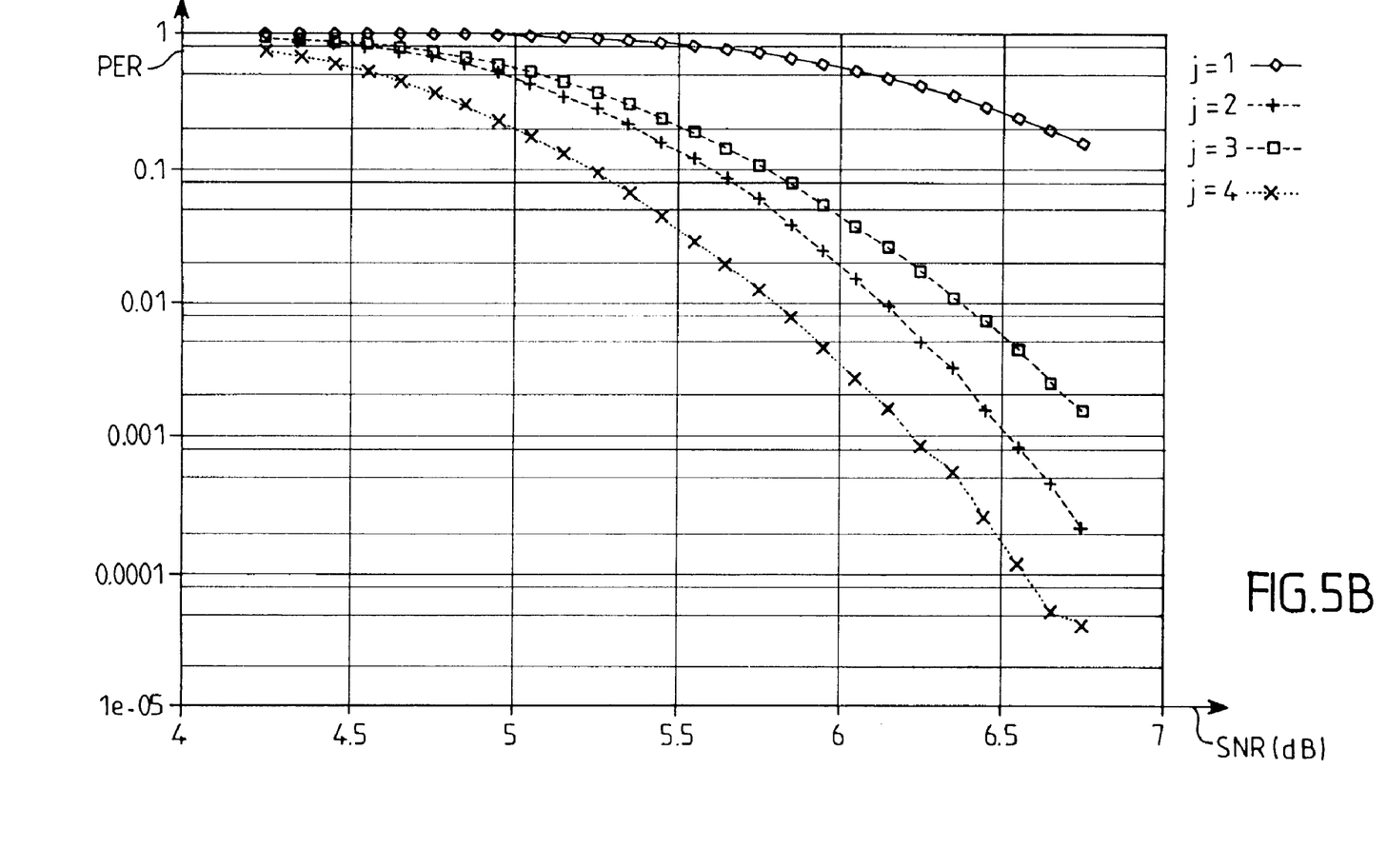

In FIGS. 5A and 5B is represented the evolution of the packet error rate PER plotted against the signal-to-noise ratio SNR expressed in dB, depending on the iterations, before the Reed Solomon decoding and after the Reed Solomon decoding respectively, with the decoder that has just been described. FIG. 5A shows that one is very near to the optimum decoding at the third iteration. The results of FIG. 5B have been obtained with a first iteration corresponding to a column decoding. In the example that has been described it is the rows of the matrix that correspond to the Reed Solomon code word. Consequently, it is the even iterations that correspond to a decoding in the direction of the Reed Solomon code words. The parity code having a tendency to bring the errors together in the direction of the decoding and the Reed Solomon code being adapted to the correction of error packets, the performance after Reed Solomon decoding is thus better for the even iterations. These Figures make it possible to conclude that optimum performance will be obtained (at minimum calculation cost) when 3 iterations are carried out in the order of row-column-row.

Figure 6A:
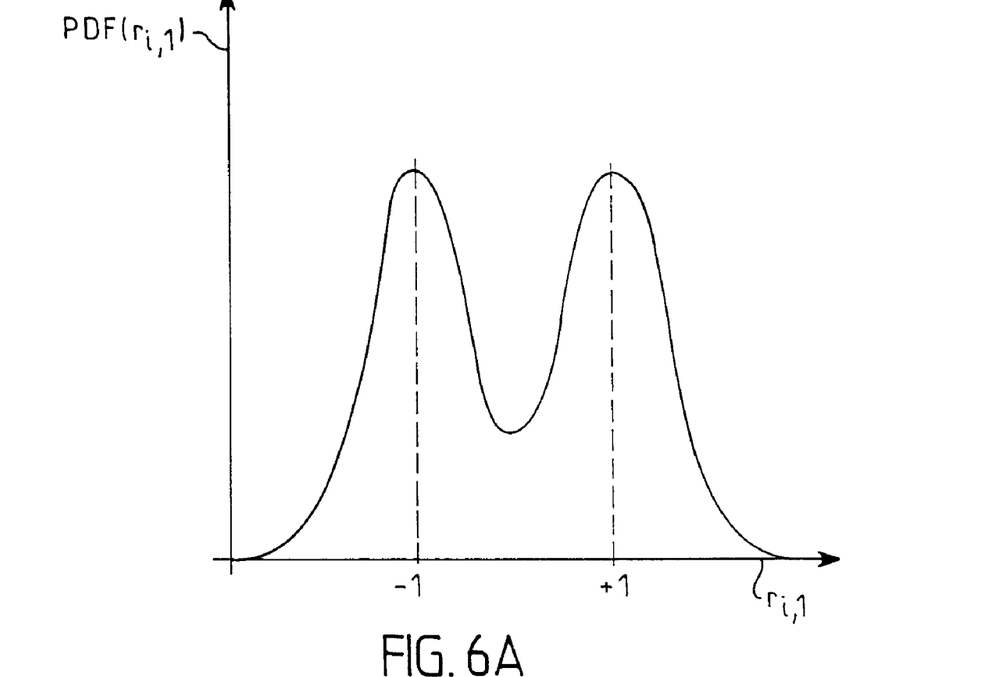
FIGS. 6A and 6B are curves representing the probability density of the input data for the first and fourth iteration, respectively.
Figure 6B:
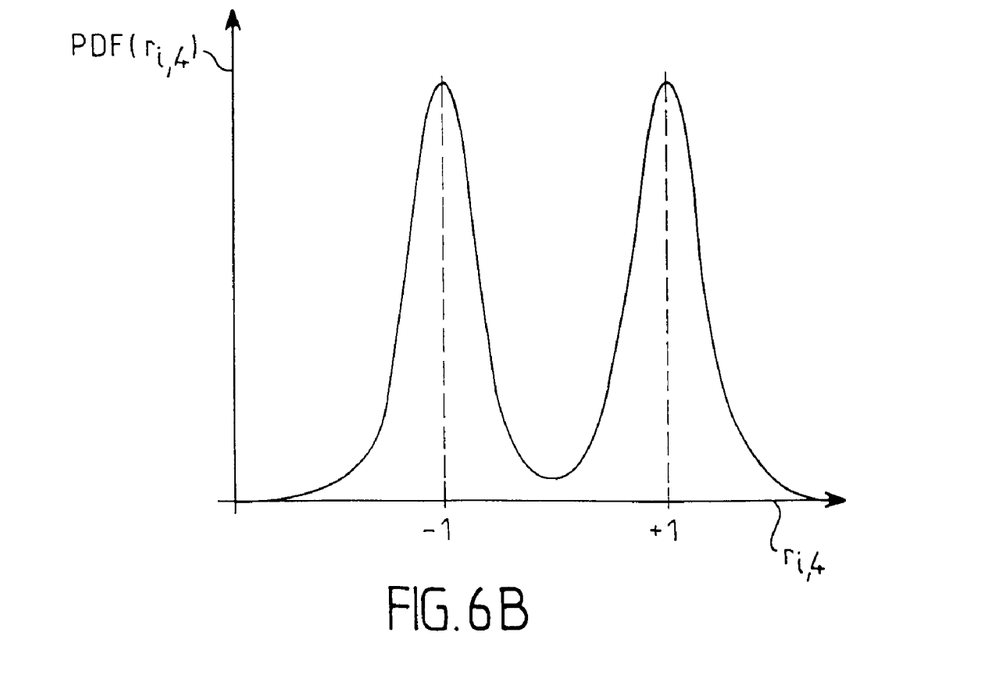

In FIGS. 6A and 6B another representation is given of the results obtained with the decoder that has just been described. These Figures respectively show the probability density function PDF ($r_{i,j}$) of the initial input data supplied to the input of the decoder before the first iteration ($r_{i,1}$) and of the subsequent input data supplied after the third iteration ($r_{i,4}$). It will be noted that this comes near to an ideal curve (zero error rate) formed by two separate envelopes around the values −1 and +1: the envelope is made narrower around the values −1 and +1, the probability density of the values −1 and +1 has increased and the intersection area is much more reduced.

The invention is not restricted to the preferred embodiment that has just been described with reference to FIGS. 3 and 4.

In a first variant of this embodiment, $\gamma_j$=1 is chosen for any j, which brings about a degradation of 0.1 to 0.2 dB of the signal-to-noise ratio SNR.

In a second variant, the mean value $\mu$ is replaced by a constant number K that depends on the signal-to-noise ratio. This also brings about a degradation of 0.1 to 0.2 dB of the signal-to-noise ratio SNR.

In a third variant, the search for the second minimum is suppressed and the following expression is used for the calculation of the reliability when i=iMIN1 :

$$f_{iMIN1,j}=(1+inv).MIN1+\Delta$$

where $\Delta$ is a constant number that depends on the signal-to-noise ratio of the signal (simulations have shown that a degradation of the order of 0.1 dB could result when $\Delta$=0.1).

In another embodiment, the function $t_{i,j}$ of the soft decisions $r'_{i,j}$ is replaced by another function than that which has just been described $$\left( t_{i,j} = r'_{i,j} / \mu \text{ with } \mu = \frac{1}{n} \sum_{i=1}^{n} |r'_{i,j}| \right)$$

for example by the identity function which amounts to be limited to a weighting operation between the soft decision $r'_{i,j}$ and the received data $r_{i,j}$:

$$r''_{i,j} = \gamma_j \cdot r'_{i,j} + \beta_j \cdot r_{i,1}.$$

Furthermore, in the example that has been described, the rows of the matrix exactly correspond to the Reed Solomon code words. This choice is particularly advantageous, but other corresponding types may also be used by preferably choosing a single relation between the sizes of the two codes, for example, by choosing that one is a multiple of the other.

Finally, in another embodiment, locating means of octets which are potentially erroneous are inserted in known manner between the output of the iterative decoding means 20 and the input of the Reed Solomon decoding means 22. By way of example, such locating means consist of comparing the first minimum MIN1, or the mean value of the reliability data, to a fixed or variable threshold beyond which a data called efficiency data is delivered to the Reed Solomon decoding means 22. For more details, reference be made to the title cited above "Error control techniques for digital communications".

What is claimed is:

1. A digital transmission system comprising at a transmitting end data (1) coding means (3), and at a receiving end iterative decoding means (20) for making hard decisions about received data (10), said iterative decoding means using said received data as initial input data, and including calculating means (220) for calculating for each iteration reliability data ($f_{i,j}$) relating to soft decisions ($r'_{i,j}$) based on input data (13, $r_{i,j}$), and means for reinserting subsequent input data ($r_{i,j+1}$) for a next iteration, characterized in that said decoding means comprise transforming means (240) for calculating transformed data ($t_{i,j}$) based on said soft decisions so as to normalize the mean value of said reliability data, and means (250) for generating subsequent input data ($r_{i,j+1}$) based on said transformed data ($t_{i,j}$).

2. A digital transmission system as claimed in claim 1, characterized in that said means for generating subsequent input data comprise weighting means (260) for calculating weighted sums ($r''_{i,j}$) of a function of said transformed data ($t_{i,j}$) and of said initial input data ($r_{i,1}$) with a first ($\gamma_j$) weight factor and a second ($\beta_j$) weight factor, respectively.

3. A digital transmission system as claimed in claim 1, characterized in that said coding means comprise first coding means (4) based on a Reed Solomon code and second coding means (5) based on a multidimensional interleaved parity code, said iterative decoding means being used for restoring, based on the received data (10), the data coded by the Reed Solomon code.

4. A digital transmission system comprising at a transmitting end data coding means (3), and at a receiving end iterative decoding means (20) for making hard decisions about received data (10), said iterative decoding means using received data as initial input data, and including calculating means (220) for calculating for each iteration soft decisions ($r'_{i,j}$) based on input data (13, $r_{i,j}$), and means for reinserting subsequent input data ($r_{i,j+1}$) for a next iteration, characterized in that said decoding means (20) comprise weighting means (260) for calculating weighted sums ($r''_{i,j}$) of a function of said soft decisions ($t_{i,j}$) and of said initial input data ($r_{i,1}$) with a first ($\gamma_j$) weight factor and a second ($\beta_j$) weight factor respectively, and means for generating subsequent input data ($r_{i,j+1}$) based on said weighted sums.

5. An iterative method for decoding data using said data as initial input data, and comprising for each iteration a calculation step (140) for calculating, based on input data (13), reliability data relating to soft decisions ($r'_{i,j}$) and a step for reinserting subsequent input data for the next iteration, characterized in that the method comprises a transforming step (160) for calculating transformed data ($t_{i,j}$) based on said soft decisions so as to normalize the mean value of said reliability data, and a step (160) for generating subsequent input data ($r_{i,j+1}$) based on said transformed data.

6. An iterative method as claimed in claim 5, characterized in that said step (160) for generating subsequent input data comprises a weighting step for calculating weighted sums ($r''_{i,j}$) of said transformed data and of said initial input data ($r_{i,1}$) with a first ($\gamma_j$) weight factor and a second ($\beta_j$) weight factor, respectively.

7. An iterative method for decoding data using said data as initial input data, and comprising for each iteration a calculation step (140) for calculating soft decisions ($r'_{i,j}$), based on input data (13, $r_{i,j}$), and a reinsertion step for reinserting subsequent input data for the next iteration, characterized in that it comprises a weighting step (160) for calculating weighted sums ($r''_{i,j}$) of a function ($t_{i,j}$) of said soft decisions and of said initial input data ($r_{i,1}$) with a first ($\gamma_j$) weight factor and a second ($\beta_j$) weight factor, respectively, and a step for generating subsequent input data ($r_{i,j+1}$) based on said weighted sums.

8. A decoder for data, comprising iterative decoding means (20), said iterative decoding means using said data as initial input data, and comprising calculating means (220) for calculating for each iteration reliability data relating to soft decisions ($r'_{i,j}$) based on input data (13, $r_{i,j}$), and means for reinserting subsequent input data ($r_{i,j+1}$) for a next iteration, characterized in that said decoding means comprise transforming means (240) for calculating transformed data ($t_{i,j}$) based on said soft decisions so as to normalize the mean value of said reliability data, and means (250) for generating subsequent input data based on said transformed data.

9. A decoder as claimed in claim 8, characterized in that said generating means for generating subsequent input data comprise weighting means (260) for calculating weighted sums ($r''_{i,j}$) of said transformed data and of said initial input data with a first ($\gamma_j$) weight factor and a second ($\beta_j$) weight factor, respectively.

10. A decoder for data, comprising iterative decoding means (20), said iterative decoding means using said data as initial input data, and comprising calculating means (220) for calculating for each iteration soft decisions ($r'_{i,j}$) based on input data (13, $r_{i,j}$), and means for reinserting subsequent input data ($r_{i,j+1}$) for the next iteration, characterized in that said iterative decoding means comprise weighting means (260) for calculating weighted sums ($r''_{i,j}$) of a function ($t_{i,j}$) of said soft decisions and of said initial input data ($r_{i,1}$) with a first ($\gamma_j$) weight factor and a second ($\beta_j$) weight factor respectively, and means for generating subsequent input data based on said weighted sums.

* * * * *